(12) United States Patent
Anand et al.

(10) Patent No.: US 10,680,608 B2
(45) Date of Patent: Jun. 9, 2020

(54) MULTIPLEXER CHARGE INJECTION REDUCTION (71) Applicant: TEXAS INSTRUMENTS INCORPORATED, Dallas, TX (US)

(72) Inventors: Priyank Anand, Bangalore (IN); Anand Kannan, Bangalore (IN); Venkatesh Guduri, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 64 days.

(21) Appl. No.: 15/231,350

(22) Filed: Aug. 8, 2016

(65) Prior Publication Data
US 2017/0040990 A1 Feb. 9, 2017

(30) Foreign Application Priority Data
Aug. 7, 2015 (IN) .......................... 4129/CHE/2015

(51) Int. Cl.
*H03K 17/00* (2006.01)
*H03K 17/693* (2006.01)
*H03K 17/16* (2006.01)
(52) U.S. Cl.
CPC ......... *H03K 17/693* (2013.01); *H03K 17/162* (2013.01); *H03K 2217/0018* (2013.01)

(58) Field of Classification Search
CPC ................ C12Q 1/6874; C12Q 1/6869; C12Q 2565/301; C12Q 2533/101; H03K 17/00
See application file for complete search history.

(56) References Cited

U.S. PATENT DOCUMENTS

| | | | |
|---|---|---|---|
| 2007/0151348 A1* | 7/2007 | Zdeblick | G01L 9/045 73/708 |
| 2011/0148473 A1* | 6/2011 | Wu | G11C 27/024 327/94 |
| 2013/0113520 A1* | 5/2013 | Chen | H03K 19/1737 326/58 |
| 2015/0365051 A1* | 12/2015 | Reddy | H03G 3/30 330/251 |

* cited by examiner

*Primary Examiner* — Sibin Chen
(74) *Attorney, Agent, or Firm* — John R. Pessetto; Charles A. Brill; Frank D. Cimino (57) ABSTRACT

A multiplexer comprises: a first switch; a second switch; a dummy component coupled to the first switch and the second switch and configured to: reduce a first charge injection of the first switch, and reduce a second charge injection of the second switch; and an output coupled to the first switch, the second switch, and the dummy component. A method comprises: providing an output from either a first switch or a second switch; coupling, by a dummy component, to the first switch and the second switch; using a BBM action; and reducing, by the dummy component, a first charge injection of the first switch or a second charge injection of the second switch.

11 Claims, 9 Drawing Sheets

MULTIPLEXER CHARGE INJECTION REDUCTION

CROSS-REFERENCE TO RELATED APPLICATIONS

This application claims priority to Indian provisional patent application number 4129/CHE/2015 filed on Aug. 7, 2015 by Texas Instruments Incorporated and titled "Charge Injection Cancellation Methods For Analog Multiplexers," which is incorporated by reference.

BACKGROUND

A multiplexer is a device that can select from among different input signals and output either one or more output signals based on the input signals. There are many different types of analog multiplexers. For instance, many multiplexers may have 2, 4, 8, 16, or more than 16 channels. Multiplexers are used in applications such as data acquisition, sample-and-hold, ATE, audio signal routing, battery powered, medical instrumentation, and single supply applications.

SUMMARY

In one embodiment, the disclosure includes a multiplexer comprising: a first switch; a second switch; a dummy component coupled to the first switch and the second switch and configured to: reduce a first charge injection of the first switch, and reduce a second charge injection of the second switch; and an output coupled to the first switch, the second switch, and the dummy component.

In another embodiment, the disclosure includes a method comprising: providing an output from either a first switch or a second switch; coupling, by a dummy component, to the first switch and the second switch; using a break-before-make (BBM) action; and reducing, by the dummy component, a first charge injection of the first switch or a second charge injection of the second switch.

In yet another embodiment, the disclosure includes an apparatus comprising: a first switch comprising a first gate and a first bulk; a first voltage supply configured to separately drive the first gate and the first bulk; a second switch coupled to the first switch and comprising a second gate and a second bulk; and a second voltage supply configured to separately drive the second gate and the second bulk.

BRIEF DESCRIPTION OF THE DRAWINGS

For a detailed description of various examples, reference will now be made to the accompanying drawings in which.

DETAILED DESCRIPTION

Certain terms are used throughout the following description and claims to refer to particular system components. As one skilled in the art will appreciate, different companies may refer to a component by different names. This document does not intend to distinguish between components that differ in name but not function. In the following discussion and in the claims, the terms "including" and "comprising" are used in an open-ended fashion, and thus should be interpreted to mean "including, but not limited to . . . ." Also, the term "couple" or "couples" is intended to mean either an indirect or direct wired or wireless connection. Thus, if a first device couples to a second device, that connection may be through a direct connection or through an indirect connection via other devices and connections.

The following abbreviations, acronyms, and initialisms apply:
A: address
ATE: automatic test equipment (ATE)
BBM: break before make, break-before-make
CMOS: complementary MOS
EN: enable
MOS: metal-oxide-semiconductor
NMOS: n-type MOS
pC: picocoulombs
pF: picofarads
PMOS: p-type MOS
RC: resistor-capacitor
s: seconds
V: voltage, volts.

First, data acquisition applications, sample-and-hold applications, and other applications use multiplexers comprising switches. Data acquisition applications and sample-and-hold applications are precision applications and therefore should be relatively free of non-idealities such as charge injection. A charge injection refers to a charge injected at a source or a drain of a transistor when the transistor turns on or off or refers to a charge injected at an input or an output of a switch when the switch turns on or off. A transistor or a combination of transistors may implement a switch. Switches in multiplexers may suffer from such a charge injection.

One approach to reduce or eliminate the charge injection in multiplexers is to couple a dummy component to each switch. Dummy components are termed "dummy" because they do not provide logical outputs for the multiplexers. Rather, they compensate for, or reduce or eliminate, charge injections of switches. Dummy components do so by turning off, or deactivating, when corresponding switches turn on, or activate, and by turning on when corresponding switches turn off. However, each dummy component increases a capacitance at a node where the dummy component couples to an input or an output of the corresponding switch. That capacitance, in turn, may slow down a switching operation of the switch. There is therefore a need for reducing both that charge injection and that capacitance.

Second, when weakly driven by common power rails, bulks and gates of switches and dummy components experience increased coupling during logic switching. That increased coupling causes sub-optimal charge injection compensation from the dummy components, which causes a high charge injection. This occurs in, for instance fault protection switches using virtual rails. Virtual rails, which may be internally generated using diodes or other components, might not have a strong drive capability, especially when an input approaches the power rails. Large diodes or buffers may strengthen the driving, but those components consume a lot of power or have other shortcomings.

Disclosed herein are embodiments for multiplexer charge injection reduction. The embodiments may apply to analog multiplexers. In a first embodiment, a single dummy component, which may be referred to as a charge injection compensation dummy component, couples to a plurality of switches or to all switches in a multiplexer. The dummy component uses a BBM action of the multiplexer to substantially maintain a charge injection or substantially maintain a reduction in charge injection while reducing a capacitance compared to multiplexers that couple a dummy component to each switch. In a second embodiment, a circuit separately drives gates and bulks of transistors. The separate driving of the gates and the bulks reduces coupling between the gates and the bulks during switching. The reduction of coupling, in turn, results in an improved charge injection reduction.

Figure 1:
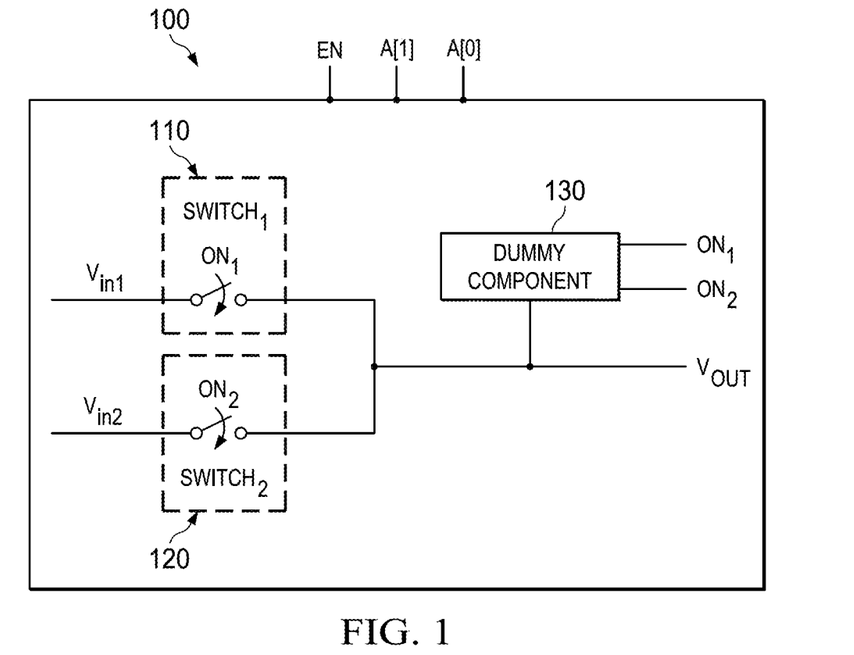
FIG. 1 is a schematic diagram of a multiplexer according to an embodiment of the disclosure.

FIG. 1 is a schematic diagram of a multiplexer 100 according to an embodiment of the disclosure. The multiplexer 100 comprises a switch$_1$ 110, a switch$_2$ 120, and a dummy component 130. The multiplexer 100 further comprises inputs $V_{in1}$, $V_{in2}$, On$_1$, On$_2$, EN, A[1], and A[0], as well as output $V_{out}$. The multiplexer 100 is shown in a simplified manner. Thus, any suitable logical components may implement the logic of the multiplexer 100.

The switch$_1$ 110 and the switch$_2$ 120 may be NMOS transistors, PMOS transistors, CMOS transistors, or other suitable switches. The switch$_1$ 110 corresponds to a first channel, channel 1, and the switch$_2$ 120 corresponds to a second channel, channel 2. A logic high value for On$_1$ turns on, or closes, the switch$_1$ 110; a logic low value for On$_1$ turns off, or opens, the switch$_1$ 110. Similarly, a high value for On$_2$ turns on, or closes, the switch$_2$ 120; a low value for On$_2$ turns off, or opens, the switch$_2$ 120. When the switch$_1$ 110 is on and the switch$_2$ 120 is off, then the multiplexer 100 outputs $V_{in1}$ corresponding to the switch$_1$ 110. Similarly, when the switch$_1$ 110 is off and the switch$_2$ 120 is on, then the multiplexer 100 outputs $V_{in2}$ corresponding to the switch$_2$ 120. A high value for EN enables either the switch$_1$ 110 or the switch$_2$ 120 to turn on. A low value for EN disables both the switch$_1$ 110 and the switch$_2$ 120.

Any other suitable logic levels for ON and EN may turn on and turn off the switch$_1$ 110 and the switch$_2$ 120. A logic high and a logic low may be defined in any suitable manner. For instance, a logic high for an NMOS switch is a physical high voltage of 5 V, while a logic low for the NMOS switch is a physical low voltage of 0 V. A logic high for a PMOS switch is a physical low voltage of 0 V, while a logic low for the PMOS switch is a physical high voltage of 5 V.

The dummy component 130 may be an NMOS transistor, a PMOS transistor, a capacitor, CMOS transistors, or another suitable dummy component. In examples where the dummy component 130 is a transistor, the transistor may be coupled between the terminals (e.g., conduction terminals) of one or both of the switches 110, 120 and $V_{out}$. For example, a first current conduction terminal (e.g., source or drain terminal) of the transistor may be coupled to terminals of one or both of the switches 110, 120 and a second current conduction terminal (e.g., source or drain terminal) of the transistor may be coupled to $V_{out}$. A control terminal of the transistor (e.g., a gate terminal) may be coupled to the output of dummy component control logic, which is discussed below. In examples where the dummy component 130 is a capacitor, a first terminal of the capacitor may be coupled to the output of the dummy control logic, and a second terminal of the capacitor may be coupled to the terminals of one or both of the switches 110, 120 and to $V_{out}$.

The dummy component 130 may comprise control logic. Any suitable logical combination of On$_1$ and On$_2$ controls the dummy component 130. The dummy component 130 turns on when one of two events occurs. For a first event, the dummy component 130 turns on when EN disables both channel 1 and channel 2. For a second event, the dummy component 130 turns on for a time $t_{BBM}$ when the multiplexer 100 transitions from either channel 1 to channel 2 or from channel 2 to channel 1. From both events, the dummy component 130 reduces or eliminates any charge injected when the switch$_1$ 110 and the switch$_2$ 120 turn off. The dummy component 130 does so by proving an equal and opposite charge.

Though the multiplexer 100 is shown as comprising the switch$_1$ 110, and the switch$_2$ 120, the multiplexer 100 may comprise any number of such switches and corresponding channels. Though the multiplexer 100 is shown as comprising a single, or common, dummy component 130 coupled to both the switch$_1$ 110 and the switch$_2$ 120, the multiplexer 100 may comprise any number of such dummy components. Thus, the multiplexer 100 may comprise 2, 4, 8, 16, or more switches coupled to one dummy component; 2, 4, 8, 16, or more switches coupled to two dummy components; or other suitable combinations of switches and dummy components. In some examples, the total number of dummy components in the multiplexer 100 may be less than the total number of channels and/or inputs in the multiplexer 100.

The multiplexer 100 takes advantage of its BBM action. The BBM action ensures that both the switch$_1$ 110 and the switch$_2$ 120 are completely off when the multiplexer 100 transitions from either the switch$_1$ 110 to the switch$_2$ 120 or from the switch$_2$ 120 to the switch$_1$ 110. Thus, the multiplexer 100 may have only one of the switches on at a time. A delay circuit such as a chain of inverters or an RC circuit may implement the BBM action.

There are at least two considerations related to the multiplexer 100. First, as mentioned above, a logical combination of On$_1$ and On$_2$ controls the dummy component 130. In other words, the dummy component 130 is a logical combination of the switch$_1$ 110 and the switch$_2$ 120. As a result, as a number of switches in the multiplexer 100 increases, a logic delay between when the switches turn on or turn off and when the dummy component 130 turns on or turns off also increases. To address that, the multiplexer 100 may comprise delay element before switch control signals in order to closely synchronize those control signals with the control of the dummy component 130. In addition, both the switch$_1$ 110 and the switch$_2$ 120 should turn off before the dummy component 130 turns on. Second, continuously transitioning between the switch$_1$ 110 and the switch$_2$ 120 causes a fast turn on and turn off of the switch$_1$ 110 and the switch$_2$ 120 and may require proper BBM action to turn on and turn off the dummy component 130, which is synchronized with the switch$_1$ 110 and the switch$_2$ 120.

Figure 2:
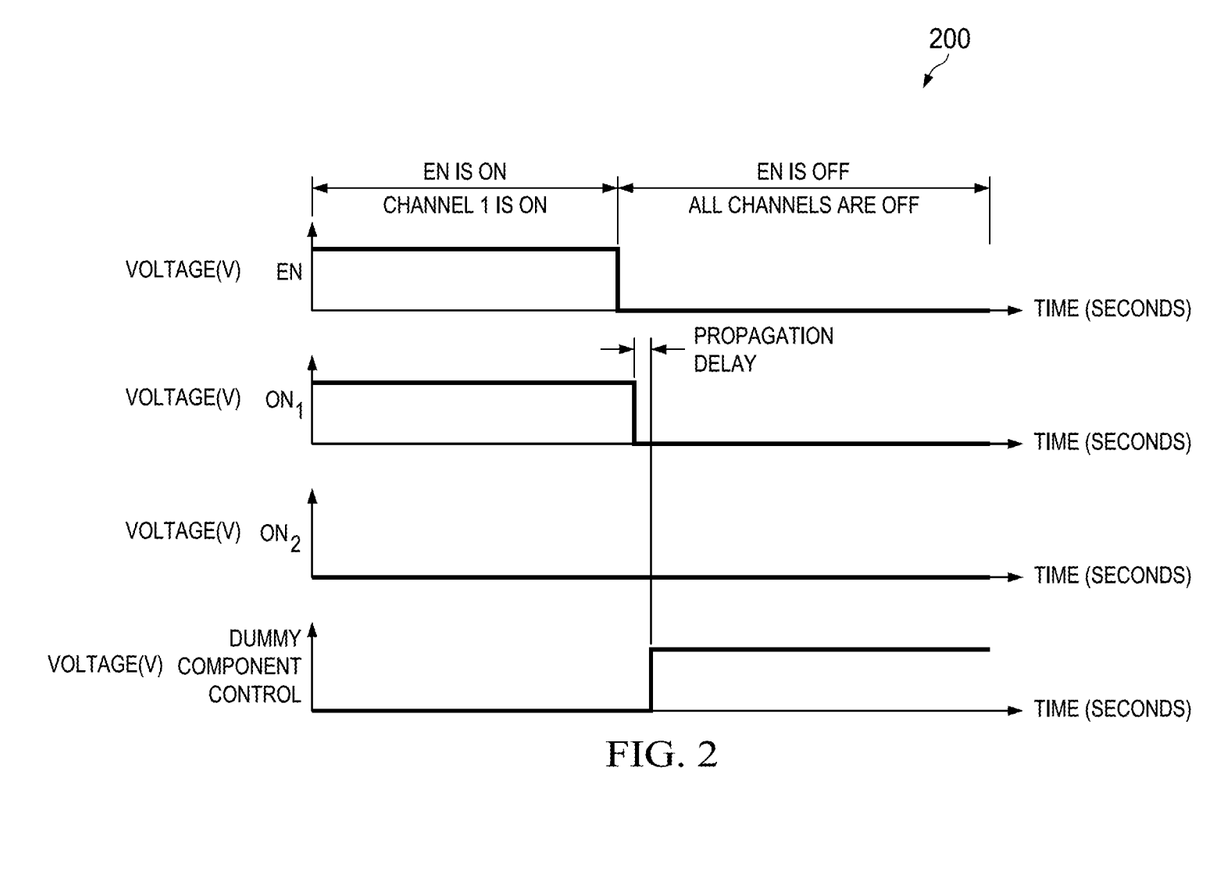
FIG. 2 is a signal timing diagram illustrating a relationship between EN and the dummy component in the multiplexer in FIG. 1.

FIG. 2 is a signal timing diagram 200 illustrating a relationship between EN and the dummy component 130 in the multiplexer 100 in FIG. 1. The x-axis represent time in s, and the y-axes represent voltages in V. As shown, when EN is high, the dummy component 130 is off. At the same time, $On_1$ may be high so that channel 1 is on. As mentioned above, $On_2$ may not be high and channel 2 may not be on when channel 1 is on. When EN transitions from high to low, after a small propagation delay $On_1$ transitions from high to low and channel 1 turns off. At the same time or after a small propagation delay, the dummy component control transitions from low to high and the dummy component 130 turns on.

Figure 3:
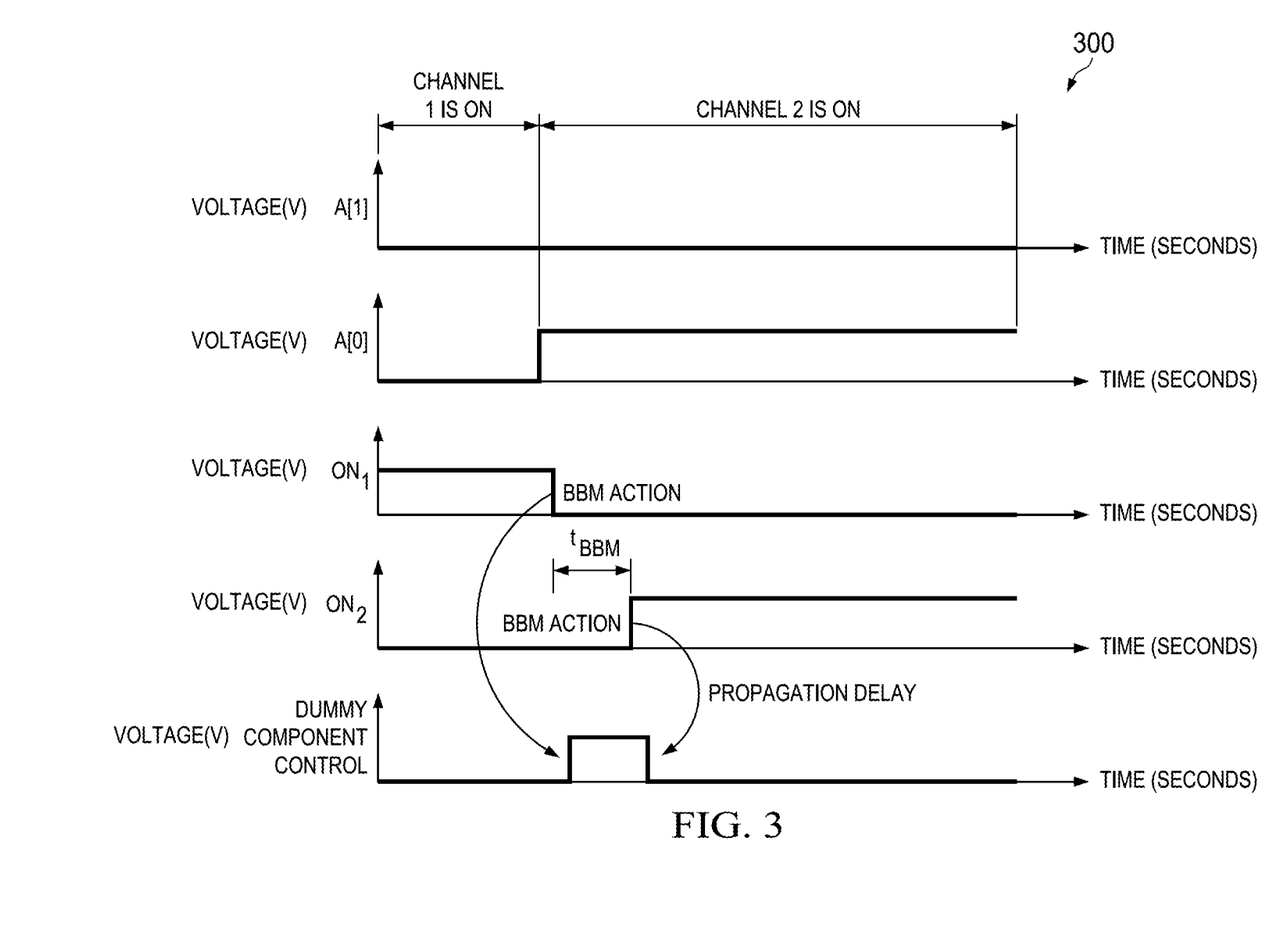
FIG. 3 is a signal timing diagram illustrating a relationship between the break-before-make (BBM) action and the dummy component in the multiplexer 100 in FIG. 1.

FIG. 3 is a signal timing diagram 300 illustrating a relationship between the BBM action and the dummy component 130 in the multiplexer 100 in FIG. 1. The x-axis represents time in s, and the y-axes represent voltage in V. As shown, A[1] and A[0] may be 00 so that $On_1$ is high and channel 1 is on. A transition of A[1] and A[0] from 00 to 01 signals a switch from channel 1 to channel 2. Specifically, $On_1$ transitions from high to low, or "breaks," at a break time and channel 1 turns off. After a propagation delay, the dummy component 130 turns on. Both $On_1$ and $On_2$, and thus both channel 1 and channel 2, remain off for the time $t_{BBM}$. After the time $t_{BBM}$, $On_2$ transitions from low to high, or "makes" at a make time. Thus, the time between the break time and the make time is the time $t_{BBM}$. After a propagation delay, the dummy component 130 turns off. In short, there is a BBM action when there is a transition from one channel to another channel, and the dummy component 130 turns on after the break and turns off after the make.

Figure 4:
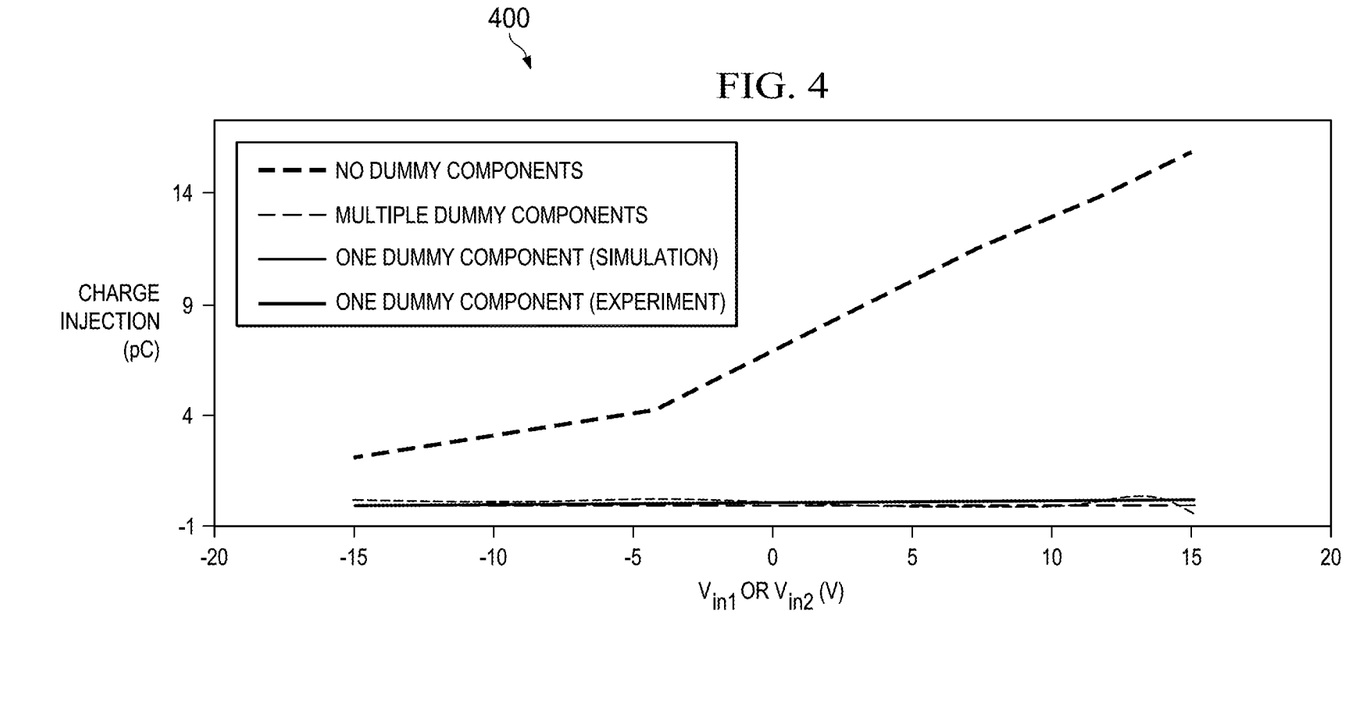
FIG. 4 is a graph of charge injection curves for different multiplexers.

FIG. 4 is a graph 400 of charge injection curves for different multiplexers. The x-axis represents $V_{in1}$ or $V_{in2}$ in V, and the y-axis represents a charge injection in pC. The graph 400 comprises four curves representing different multiplexers. The green curve represents a multiplexer with no dummy components, the red curve represents a multiplexer with multiple dummy components, the blue curve represents a simulation of a multiplexer such as the multiplexer 100 with one dummy component such as the dummy component 130 per four switches, and the black curve represents an experiment of a multiplexer such as the multiplexer 100 with one dummy component such as the dummy component 130 per four switches. As shown, the multiplexer with no dummy component exhibits a very high charge injection, particularly as $V_{in1}$ or $V_{in2}$ increases. However, the curves representing the multiplexer with multiple dummy components, the simulated multiplexer with one dummy component per four switches, and the experimental multiplexer with one dummy component per four switches appear indistinguishable.

Figure 5:
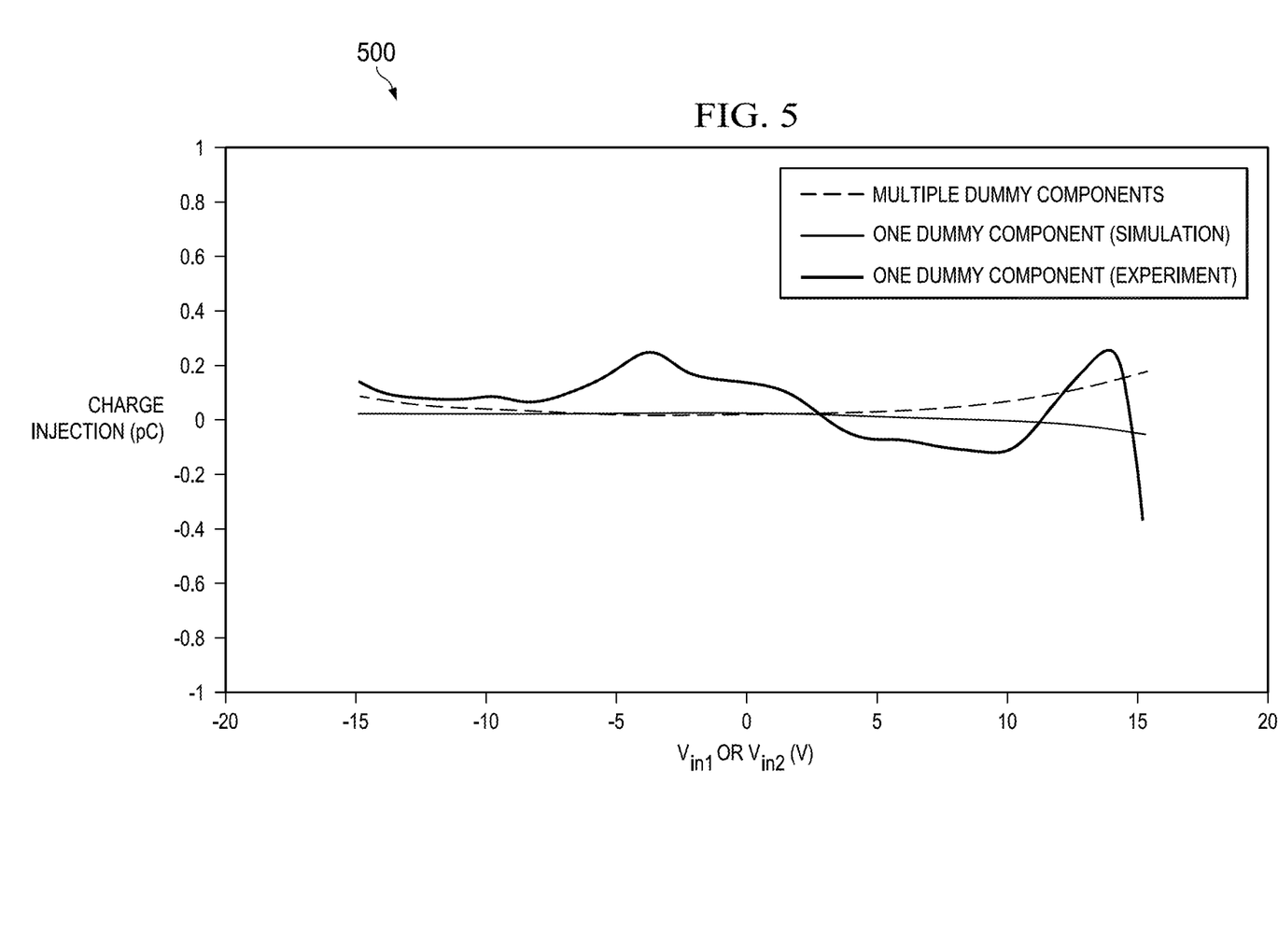
FIG. 5 is another graph of charge injection curves for different multiplexers.

FIG. 5 is another graph 500 of charge injection curves for different multiplexers. The x-axis represents $V_{in1}$ or $V_{in2}$ in V, and the y-axis represents a charge injection in pC. The graph 500 is an enlargement of a portion of the graph 400 in FIG. 4 that highlights the red curve, the blue curve, and the black curve from the graph 400. As shown, the multiplexer with multiple dummy components, the simulated multiplexer with one dummy component per four switches, and the experimental multiplexer with one dummy component per four switches exhibit similar charge injection characteristics.

Figure 6:
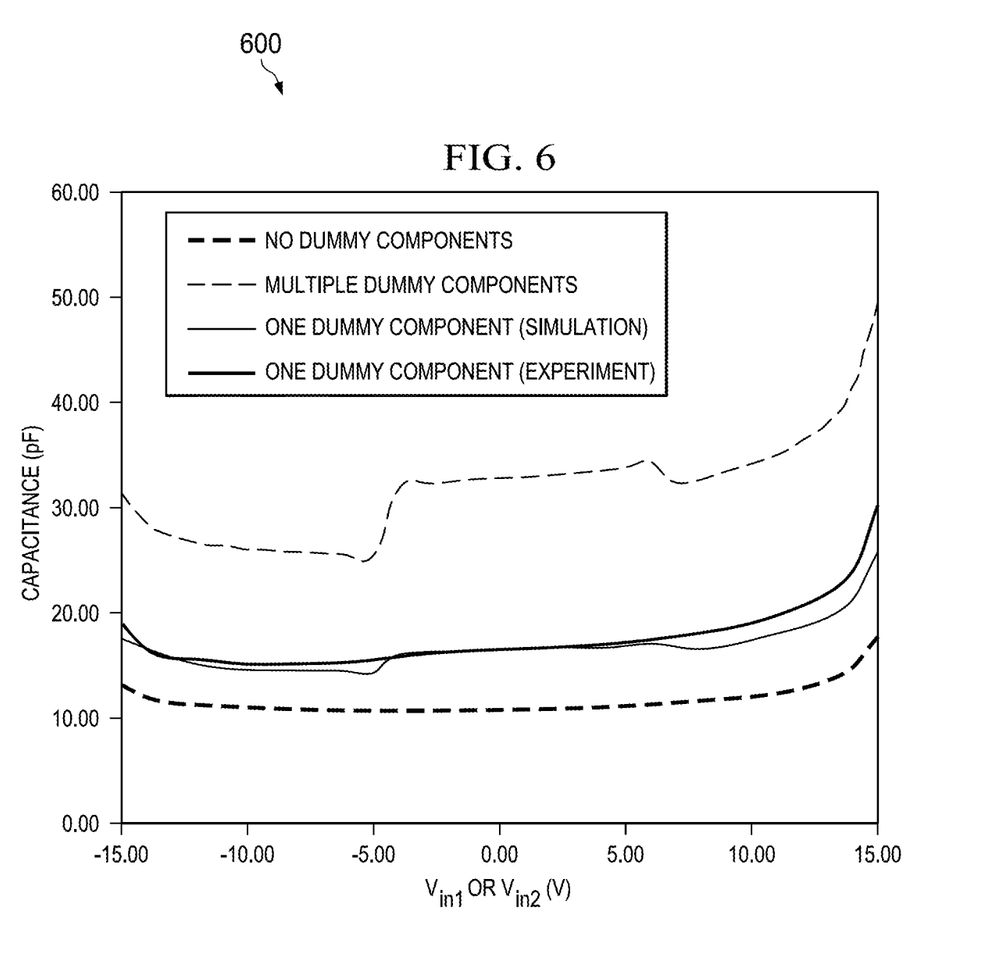
FIG. 6 is a graph of capacitance curves for different multiplexers.

FIG. 6 is a graph 600 of capacitance curves for different multiplexers. The x-axis represents $V_{in1}$ or $V_{in2}$ in V, and the y-axis represents a capacitance at the pF. The green curve represents a multiplexer with no dummy components, the red curve represents a multiplexer with multiple dummy components, the blue curve represents a simulation of a multiplexer such as the multiplexer 100 with one dummy component such as the dummy component 130 per four switches, and the black curve represents an experiment of a multiplexer such as the multiplexer 100 with one dummy component such as the dummy component 130 per four switches. As shown, the multiplexer with no dummy components exhibits the lowest capacitance, but as shown in the graph 400, that multiplexer exhibits a very high charge injection, which may not be acceptable in practical applications. The multiplexer with multiple dummy components exhibits a relatively high capacitance, while the simulated multiplexer with one dummy component per four switches and the experimental multiplexer with one dummy component per four switches exhibit lower capacitances that are closer to the capacitance of the multiplexer with no dummy components. Thus, the multiplexer with one dummy component per four switches provides both an acceptable charge injection and an acceptable capacitance.

Figure 7:
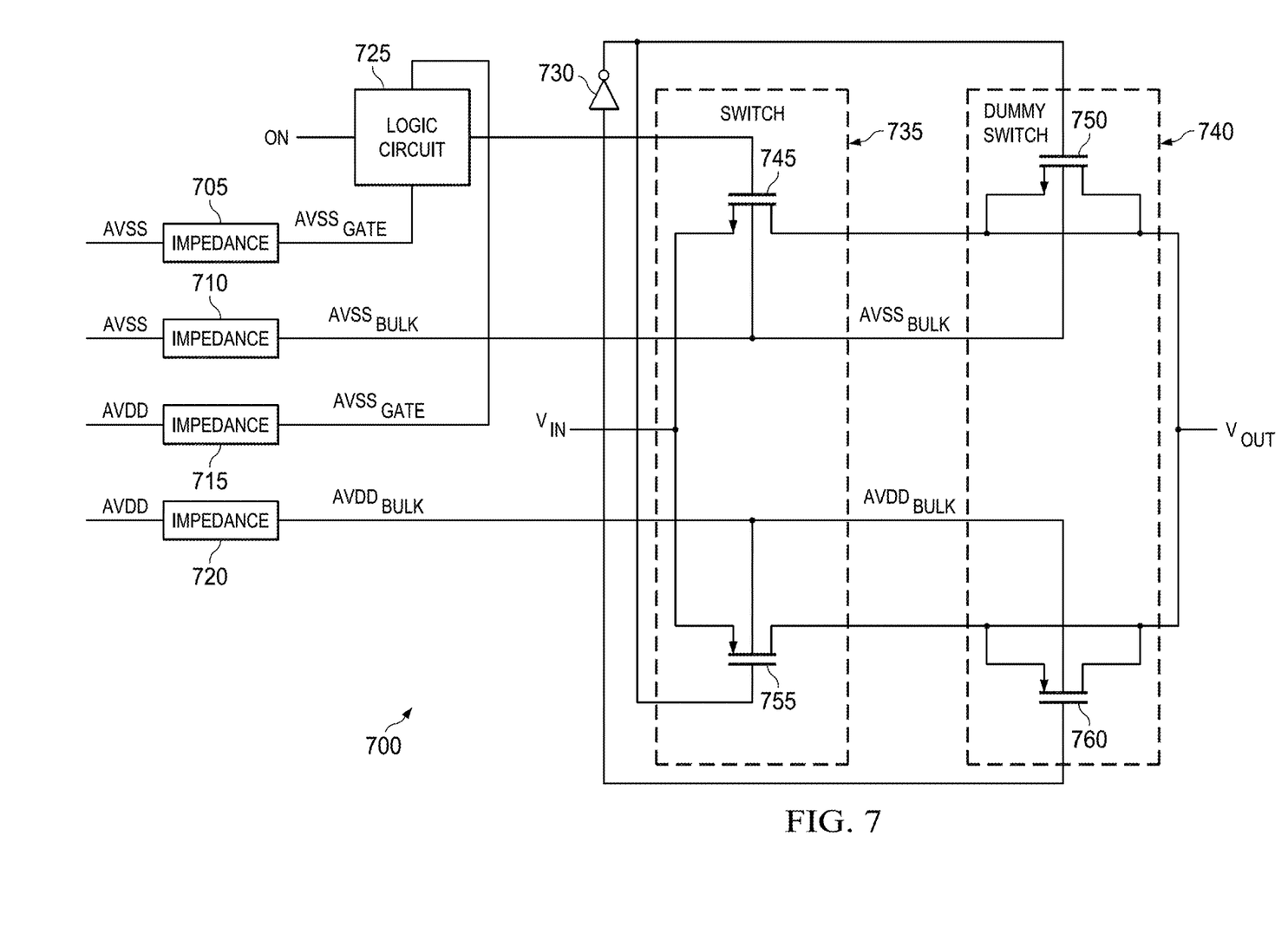
FIG. 7 is a schematic diagram of a circuit according to an embodiment of the disclosure.

FIG. 7 is a schematic diagram of a circuit 700 according to an embodiment of the disclosure. The circuit 700 comprises impedances 705, 710, 715, 720; a logic circuit 725; an inverter 730; a switch 735; and a dummy switch 740. The circuit 700 further comprises voltage supplies AVSS, AVDD; inputs $V_{in}$ and On; and an output $V_{out}$. The circuit 700 is shown in a simplified manner. Thus, any suitable logical components may implement the logic of the circuit 700.

The switch 735 and the dummy switch 740 both comprise CMOS transistors 745, 750, 755, 760. Each of the CMOS transistors 745-760 comprises a bulk and a gate. As further shown, the bulks and the gates of the transistors 745-760 are separately driven. Specifically, the impedance 705 produces $AVSS_{Gate}$ from AVSS, and $AVSS_{Gate}$ drives the gates of the NMOS transistors 745, 750. The impedance 710 produces $AVSS_{Bulk}$ from AVSS, and $AVSS_{Bulk}$ drives the bulks of the NMOS transistors 745, 750. The impedance 715 produces $AVDD_{Gate}$ from AVDD, and $AVDD_{Gate}$ drives the gates of the PMOS transistors 755, 760. Finally, the impedance 720 produces $AVDD_{Bulk}$ from AVDD, and $AVDD_{Bulk}$ drives the gates of the PMOS transistors 755, 760. The separate driving of the gates and the bulks reduces coupling between the gates and the bulks during switching, resulting in improved charge injection reducing by the dummy switch 740.

Figure 8:
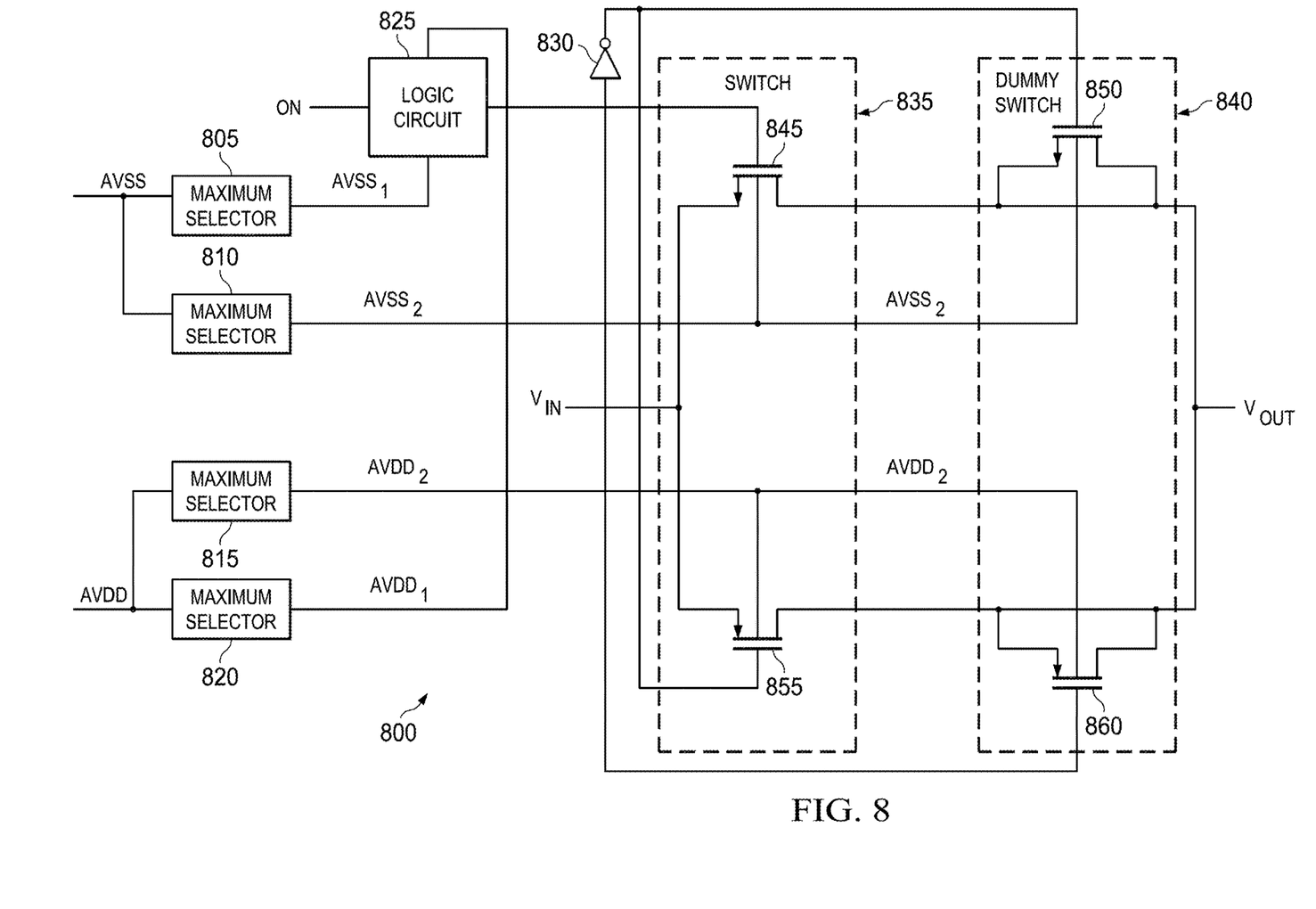
FIG. 8 is a schematic diagram of a fault-protection circuit according to an embodiment of the disclosure.

FIG. 8 is a schematic diagram of a fault-protection circuit 800 according to an embodiment of the disclosure. The fault-protection circuit 800 is an example implementation of the circuit 700 in FIG. 7. For instance, the fault-protection circuit 800 comprises a logic circuit 825, an inverter 830, a switch 835, and a dummy switch 840. However, the fault-protection circuit 800 comprises minimum selectors 805, 810 and maximum selectors 815, 820 to represent the impedances 705-720 in the circuit 700. The circuit 800 further comprises voltage supplies AVSS, AVDD; inputs $V_{in}$ and On; and an output $V_{out}$. The circuit 800 is shown in a simplified manner. Thus, any suitable logical components may implement the logic of the circuit 800.

The switch 835 and the dummy switch 840 both comprise CMOS transistors 845, 850, 855, 860. Each of the CMOS transistors 845-860 comprises a bulk and a gate. As further shown, the bulks and the gates of the transistors 845-860 are separately driven. Specifically, the minimum selector 805 produces a minimum of AVSS and $V_{in}$, or $AVSS_1$, which drives the gates of the NMOS transistors 845, 850. The minimum selector 810 produces a minimum of AVSS and $V_{in}$, or $AVSS_2$, which drives the bulks of the NMOS transistors 845, 850. The maximum selector 815 produces a maximum of AVDD and $V_{in}$, or $AVDD_2$, which drives the gates of the PMOS transistors 855, 860. Finally, the maximum selector 820 produces a maximum of AVDD and $V_{in}$, or $AVDD_1$, which drives the gates of the PMOS transistors 855, 860. $AVSS_1$, $AVSS_2$, $AVDD_2$, and $AVDD_1$ are referred to as virtual rails. The separate driving of the gates and the bulks reduces coupling between the gates and the bulks during switching, resulting in improved charge injection reducing by the dummy switch 840. It is not necessary to improve the impedance of $AVSS_1$, $AVSS_2$, $AVDD_2$, and $AVDD_1$ near the rails, so the fault-protection circuit 800 is relatively low power and relatively low complexity. Though the circuit 700 and the fault-protection circuit 800 are shown, the disclosed separate driving of the gates and bulks of the transistors may be implemented in any suitable circuits.

Figure 9:
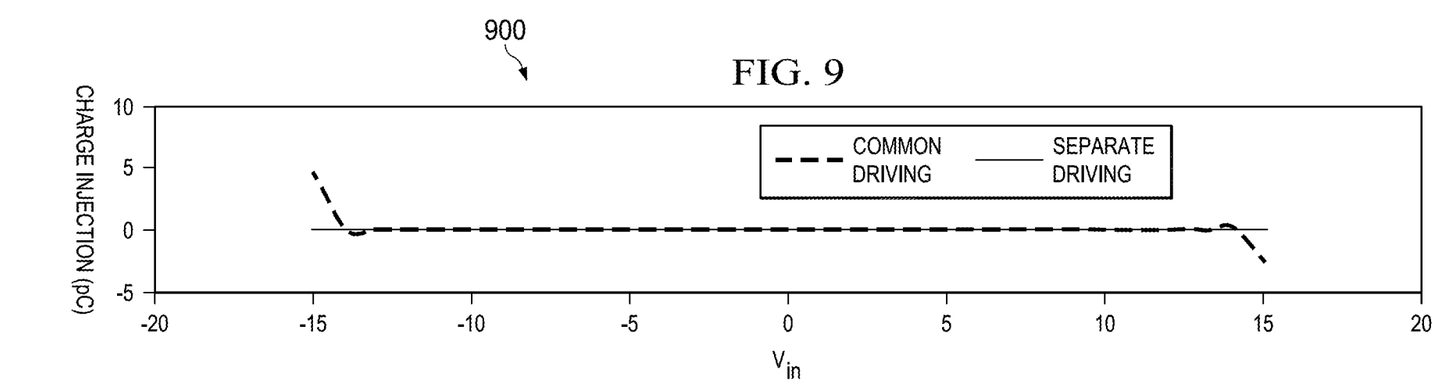
FIG. 9 is a graph of simulated charge injection curves for different circuits.

FIG. 9 is a graph 900 of simulated charge injection curves for different circuits. The x-axis represents $V_{in1}$ in V, and the y-axis represents a charge injection in pC. The graph 900 comprises two curves representing different circuits. The blue curve represents a circuit with common gate and bulk driving, and the green curve represents a circuit such as the circuit 700, 800 with separate gate and bulk driving. As shown, the charge injection of the circuit with common gate and bulk driving has sharp deviations below about −14 V and above about 14 V, while the charge injection for the circuit with separate gate and bulk driving remains substantially flat.

Figure 10:
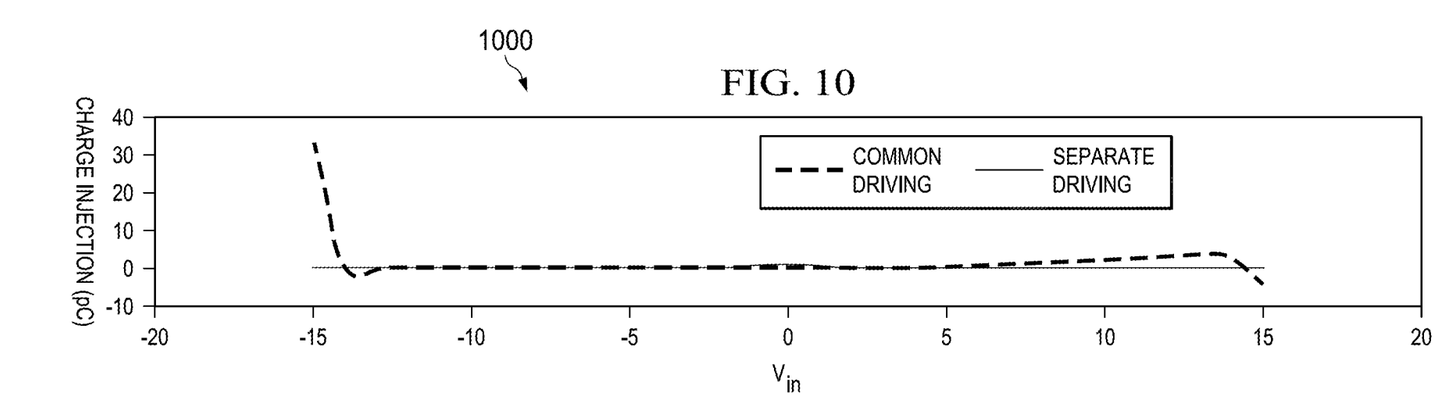
FIG. 10 is a graph of experimental charge injection curves for different circuits.

FIG. 10 is a graph 1000 of experimental charge injection curves for different circuits. The x-axis represents $V_{in1}$ in V, and the y-axis represents a charge injection in pC. The graph 1000 comprises two curves representing different circuits. The blue curve represents a circuit with common gate and bulk driving, and the green curve represents a circuit such as the circuits 700, 800 with separate gate and bulk driving. As shown, like in the graph 900 in FIG. 9, the charge injection of the circuit with common gate and bulk driving has sharp deviations below about −14 V and above about 14 V, while the charge injection for the circuit with separate gate and bulk driving remains substantially flat.

Figure 11:
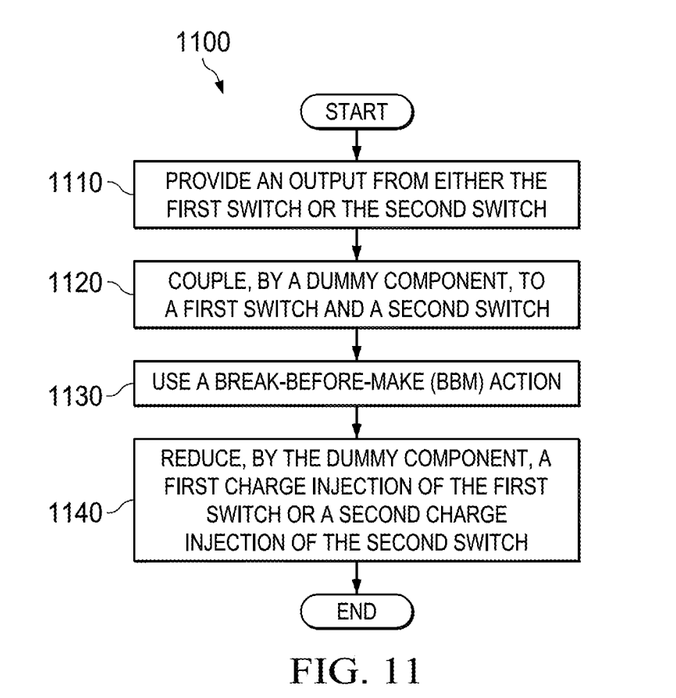
FIG. 11 is a flowchart illustrating a method of charge injection reduction according to an embodiment of the disclosure.

FIG. 11 is a flowchart illustrating a method 1100 of charge injection reduction according to an embodiment of the disclosure. The multiplexer 100 may implement the method 1100. At step 1110, an output is provided from either the first switch or the second switch. For instance, either the $switch_1$ 110 or the $switch_2$ 120 turns on and provides an output for the multiplexer 100. At step 1120, a dummy component couples to a first switch and a second switch. For instance, the dummy component 130 couples to the $switch_1$ 110 and the $switch_2$ 120. At step 1130, a BBM action is used. For instance, the dummy component 130 uses the time $t_{BBM}$ in the BBM action shown in the signal timing diagram 300. Finally, at step 1140, the dummy component reduces a first charge injection of the first switch or a second charge injection of the second switch. For instance, the dummy component 130 turns on to reduce a first charge injection of the $switch_1$ 110 or a second charge injection of the $switch_2$ 120.

A first component is directly coupled to a second component when there are no intervening components, except for a line, a trace, or another medium between the first component and the second component. The first component is indirectly coupled to the second component when there are intervening components other than a line, a trace, or another medium between the first component and the second component. The term "coupled" and its derivatives includes both directly coupled and indirectly coupled. The use of the term "about" means a range including ±10% of the subsequent number, unless otherwise stated.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A multiplexer comprising:
   a first switch having a first input and a first output wherein the first input receives a first voltage from a first voltage source;
   a second switch having a second input and a second output wherein the second input receives a second voltage from a second voltage source;
   a dummy component coupled to the first switch and the second switch and configured to:
   reduce a first charge injection of the first switch, and
   reduce a second charge injection of the second switch; and
   an output directly coupled to the first output, the second output, and the dummy component.

2. The multiplexer of claim 1, wherein the dummy component is the only dummy component in the multiplexer.

3. The multiplexer of claim 1, wherein the dummy component does not provide logical outputs for the multiplexer.

4. The multiplexer of claim 1, wherein the dummy component is further configured to use a break-before-make (BBM) action.

5. The multiplexer of claim 4, wherein the dummy component is further configured to turn on when either the first switch or the second switch breaks.

6. The multiplexer of claim 5, wherein the dummy component is further configured to turn off when either the first switch or the second switch makes.

7. The multiplexer of claim 1, wherein the dummy component comprises any combination of an n-type metal-oxide-semiconductor (NMOS) transistor, a p-type metal-oxide-semiconductor (PMOS) transistor, and a capacitor.

8. The multiplexer of claim 1, wherein the dummy component comprises complementary metal-oxide-semiconductor (CMOS) transistors.

9. The multiplexer of claim 1, further comprising:
   a third switch coupled to the dummy component; and
   a fourth switch coupled to the dummy component.

10. The multiplexer of claim 1, further comprising:
    a third switch;
    a fourth switch; and
    an additional dummy component coupled to the third switch and the fourth switch.

11. The multiplexer of claim 1, wherein the multiplexer is an analog multiplexer and comprises more than two switches coupled to the dummy component.

* * * * *